United States Patent
Song et al.

(10) Patent No.: US 12,456,987 B2
(45) Date of Patent: Oct. 28, 2025

(54) ANALOG-TO-DIGITAL CONVERSION CIRCUIT, INTEGRATED CHIP, DISPLAY DEVICE, AND ANALOG-TO-DIGITAL CONVERSION METHOD

(71) Applicants: Beijing BOE Optoelectronics Technology Co., Ltd., Beijing (CN); BOE Technology Group Co., Ltd., Beijing (CN)

(72) Inventors: Yifan Song, Beijing (CN); Xinle Wang, Beijing (CN); Wenchao Han, Beijing (CN); Mingming Wang, Beijing (CN); Wanzhi Chen, Beijing (CN); Jing Liu, Beijing (CN); Zhengri Lin, Beijing (CN)

(73) Assignees: Beijing BOE Optoelectronics Technology Co., Ltd., Beijing (CN); Beijing BOE Technology Development Co., Ltd., Beijing (CN)

( * ) Notice: Subject to any disclaimer, the term of this patent is extended or adjusted under 35 U.S.C. 154(b) by 151 days.

(21) Appl. No.: 18/561,733

(22) PCT Filed: May 19, 2021

(86) PCT No.: PCT/CN2021/094731
§ 371 (c)(1),
(2) Date: Nov. 17, 2023

(87) PCT Pub. No.: WO2022/241698
PCT Pub. Date: Nov. 24, 2022

(65) Prior Publication Data
US 2024/0275397 A1    Aug. 15, 2024

(51) Int. Cl.
*H03M 1/12* (2006.01)
(52) U.S. Cl.
CPC ................................ *H03M 1/1245* (2013.01)

(58) Field of Classification Search
CPC .............................. H03M 1/1245; H03M 1/12
See application file for complete search history.

(56) References Cited

U.S. PATENT DOCUMENTS

2006/0158362 A1* 7/2006 Shimizu ............. H03M 1/0675
341/144
2008/0224683 A1* 9/2008 Huang ................. B23K 11/258
323/318

(Continued)

FOREIGN PATENT DOCUMENTS

| CN | 104300984 A | 1/2015 |
| CN | 104852742 A | 8/2015 |
| CN | 108649954 A | 10/2018 |

OTHER PUBLICATIONS

International Search Report for PCT/CN2021/094731 Mailed Feb. 24, 2022.

*Primary Examiner* — Omeed Alizada
(74) *Attorney, Agent, or Firm* — Ling Wu; Stephen Yang; Ling and Yang Intellectual Property (57) ABSTRACT

Disclosed in embodiments of the present disclosure are an analog-to-digital conversion circuit, an integrated chip, a display device, and an analog-to-digital conversion method. A first conversion circuit converts an original analog signal to obtain a digital signal of a first bit width; a voltage division circuit performs voltage division on a first-level analog signal to obtain a second-level analog signal, the first-level analog signal being an original analog signal or a second-level analog signal obtained by a previous voltage division circuit adjacent to the voltage division circuit; a second conversion circuit converts the received second-level analog signal according to a preset algorithm to obtain a second digital signal of a second bit width; and a control (Continued)

calculation circuit obtains a target digital signal of a third bit width according to the first digital signal and the second digital signal.

18 Claims, 5 Drawing Sheets

(56) References Cited

U.S. PATENT DOCUMENTS

2009/0033534 A1  2/2009  Kobayashi et al.
2015/0236710 A1  8/2015  Bogner et al.
2019/0007056 A1* 1/2019  Kano .................... H03K 23/00

* cited by examiner

FIG. 6

ANALOG-TO-DIGITAL CONVERSION CIRCUIT, INTEGRATED CHIP, DISPLAY DEVICE, AND ANALOG-TO-DIGITAL CONVERSION METHOD

CROSS-REFERENCE TO RELATED APPLICATION

The present application is a U.S. National Phase Entry of International Application PCT/CN2021/094731 having an international filing date of May 19, 2021, and entitled "Analog-to-Digital Conversion Circuit, Integrated Chip, Display Device, and Analog-to-Digital Conversion Method", the contents of which are hereby incorporated herein by reference in their entireties.

TECHNICAL FIELD

The present disclosure relates to the field of electronic technology, in particular to an analog-to-digital conversion circuit, an integrated chip, a display device and an analog-to-digital conversion method.

BACKGROUND

Analog-to-Digital Converter (ADC) is mainly used to convert analog signals into digital signals. With the development of science and technology, ADC is widely used in various measurement systems that need to process analog sensor signals, such as data acquisition systems for measuring pressure, flow rate, speed and temperature. Generally, these signals belong to time domain signatures and appear in the form of pulse or step function. In any design, it is understood that total system accuracy is very important for these types of applications, especially those systems that need to quantify minimal sensitivity and changes in waveforms.

At present, conversion accuracy and cost of an ADC mainly depend on a bit width of the ADC. The higher the bit width of the ADC, the higher a sampling accuracy of ADC. Because the cost of the ADC increases exponentially with the bit width of the ADC, ADC with a low bit width is usually used to convert analog signals for saving cost. However, ADC with low bit width will lead to low accuracy of converted digital signals.

SUMMARY

The present disclosure aims at providing an analog-to-digital conversion circuit, an integrated chip, a display device and an analog-to-digital conversion method.

According to a first aspect of the present disclosure, an analog-to-digital conversion circuit is provided, which includes:

a first conversion circuit, configured to convert an original analog signal to obtain a first digital signal with a first bit width;

at least one voltage division circuit, each voltage division circuit among which is configured to divide a voltage of a first-stage analog signal to obtain a second-stage analog signal, wherein the first-stage analog signal is the original analog signal or a second-stage analog signal output by a previous voltage division circuit adjacent to the voltage division circuit;

a second conversion circuit corresponding to the voltage division circuit, configured to convert the received second-stage analog signal according to a preset algorithm to obtain a second digital signal with a second bit width; and a control calculation circuit, configured to obtain a target digital signal with a third bit width according to the first digital signal and the second digital signal;

wherein the third bit width is larger than the first bit width, and the third bit width is larger than the second bit width.

In some examples, each voltage division circuit includes a plurality of voltage division resistors and a first switching transistors corresponding to each of the voltage division resistors;

the plurality of voltage division resistors are connected in series;

in the voltage division resistors which are connected in series, a first end of each voltage division resistor is connected with a first end of the corresponding first switching transistor;

second ends of the first switching transistor are connected to each other and a second end of each first switching transistor is connected to the second conversion circuit corresponding to the voltage division circuit, and a control end of each of the first switching transistors is connected to the control calculation circuit; and a first end of a first voltage division resistor is used for inputting the first-stage analog signal, and a second end of a last voltage division resistor is grounded.

In some examples, a quantity of voltage division circuits in the at least one voltage division circuit is one; and the first-stage analog signal is the original analog signal.

In some examples, a quantity of voltage division circuits in the at least one voltage division circuit is a plurality, and the plurality of voltage division circuits are connected in series; and the first-stage analog signal is a second-stage analog signal output by a previous voltage division circuit connected in series with the voltage division circuit.

In some examples, a quantity of voltage division circuits in the at least one voltage division circuit is a plurality, and the plurality of voltage division circuits are connected in parallel; and the first-stage analog signal is the original analog signal.

In some examples, the control calculation circuit is configured to control one first switching transistor of the at least one voltage division circuit to turn on according to the first digital signal.

In some examples, the first conversion circuit includes a first analog-to-digital converter with the first bit width and a second switching transistor;

a first end of the second switching transistor is configured to input the original analog signal, a second end of the second switching transistor is electrically connected with an input end of the first analog-to-digital converter, a control end of the second switching transistor is electrically connected with the control calculation circuit, and an output end of the first analog-to-digital converter is electrically connected with the control calculation circuit; and the control calculation circuit is configured to control the second switching transistor to turn on at a first sampling time and to control the second switching transistor to turn off at a second sampling time, wherein the first sampling time is earlier than the second sampling time.

In some examples, the second conversion circuit includes a second analog-to-digital converter;

an input end of the second analog-to-digital converter is electrically connected with a second end of each first switching transistor in a voltage division circuit corresponding to the second analog-to-digital converter, and an output end of the second analog-to-digital converter is electrically connected with the control calculation circuit; and the control calculation circuit is configured to control a first switching transistor corresponding to a first voltage division resistor of the at least one voltage division circuit at the second sampling time if the first digital signal is within a first preset range; to control one first switching transistor of the at least one voltage division circuit to turn on at the second sampling time according to the first digital signal if the first digital signal is within a second preset range.

In some examples, the control calculation circuit is configured to:

adjust the first digital signal based on a preset value;

sum the adjusted digital signal and the second digital signal as the target digital signal.

In some examples, the bit width of the first analog-to-digital converter is equal to the bit width of the second analog-to-digital converter.

In some examples, the preset algorithm is an A-law 13 polyline algorithm.

According to a second aspect of the present disclosure, an integrated chip is provided, which includes any of the analog-to-digital conversion circuits described above.

According to a third aspect of the present disclosure, a display device is provided, which includes the integrated chip described above.

According to a fourth aspect of the present disclosure, an analog-to-digital conversion method is provided, which is applied to any one of the analog-to-digital conversion circuits described in the first aspect and includes:

converting, by the first conversion circuit, the received original analog signal to obtain the first digital signal with the first bit width;

performing voltage division, by one voltage division circuit of the at least one voltage division circuit, on the first-stage analog signal to obtain the second-stage analog signal, wherein the first-stage analog signal is the original analog signal or the second-stage analog signal obtained by the previous voltage division circuit adjacent to the one voltage division circuit;

converting, by the second conversion circuit, the received second-stage analog signal according to the preset algorithm to obtain the second digital signal with the second bit width;

obtaining the target digital signal with the third bit width according to the first digital signal and the second digital signal;

wherein the third bit width is larger than the first bit width, and the third bit width is larger than the second bit width.

In some examples, a quantity of voltage division circuits in the at least one voltage division circuit is one;

the step of performing the voltage division by the one voltage division circuit of the at least one voltage division circuit on the first-stage analog signal to obtain the second-stage analog signal includes:

according to the first digital signal, performing voltage division on the first-stage analog signal by controlling one switching transistor in the voltage division circuit to turn on to obtain the second-stage analog signal, wherein the first-stage analog signal is the original analog signal.

In some examples, a quantity of voltage division circuits in the at least one voltage division circuit is a plurality, and the plurality of voltage division circuits are connected in series;

the step of performing the voltage division by the one voltage division circuit of the at least one voltage division circuit on the first-stage analog signal to obtain the second-stage analog signal includes:

according to the first digital signal, performing voltage division on the first-stage analog signal by controlling one switching transistor in one voltage division circuit of the at least one voltage division circuit to turn on to obtain the second-stage analog signal, wherein the first-stage analog signal is a second-stage analog signal output by a previous voltage division circuit adjacent to the one voltage division circuit.

In some examples, a quantity of voltage division circuits in the at least one voltage division circuit is a plurality, and the plurality of voltage division circuits are connected in parallel;

the step of performing the voltage division by the one voltage division circuit of the at least one voltage division circuit on the first-stage analog signal to obtain the second-stage analog signal includes:

according to the first digital signal, performing voltage division on the first-stage analog signal by controlling one switching transistor in one voltage division circuit of the at least one voltage division circuit to turn on to obtain the second-stage analog signal, wherein the first-stage analog signal is the original analog signal.

In some examples, the second-stage analog signal is equal to the original analog signal by controlling one switching transistor in one voltage division circuit of the at least one voltage division circuit to turn on if the first digital signal is within a first preset range; and voltage division is performed on the original analog signal according to the first digital signal by controlling one switching transistor in one voltage division circuit of the at least one voltage division circuit to turn on to obtain the second-stage analog signal if the first digital signal is within a second preset range.

In some examples, the step of obtaining the target digital signal with the third bit width according to the first digital signal and the second digital signal value includes:

adjusting the first digital signal based on a preset value; and summing the adjusted digital signal and the second digital signal as the target digital signal.

It is understood that the above general description and the following detailed description are exemplary and explanatory only and are not intended to limit the present disclosure.

DETAILED DESCRIPTION

In order to make objectives, technical solutions and advantages of the embodiments of the present disclosure more clear, the technical solutions of the embodiments of the present disclosure will be clearly and completely described below with reference to the drawings of the embodiments of the present disclosure. Apparently, the described embodiments are a part of the embodiments of the present disclosure, not all of the embodiments. Furthermore, embodiments in the present disclosure and features in the embodiments may be combined with each other if there is no conflict. Based on the described embodiments of the present disclosure, all other embodiments obtained by those of ordinary skills in the art without inventive effort are within the protection scope of the present disclosure.

Unless otherwise defined, technical terms or scientific terms used in the present disclosure should have meanings as commonly understood by those of ordinary skill in the art to which the present disclosure pertains. The "first", "second" and similar terms used in the present disclosure do not indicate any order, quantity, or importance, but are used only for distinguishing different components. "Include", "contain", or a similar word means that elements or objects appearing before the words cover elements or objects listed after the words and their equivalents, but do not exclude other elements or objects. "Connect", "join", or a similar term is not limited to a physical or mechanical connection, but may include an electrical connection, whether direct or indirect.

It should be noted that sizes and shapes of various figures in the drawings do not reflect actual scales, and are only for the purpose of schematically illustrating contents of the present disclosure. Moreover, the same or similar elements and the elements having same or similar functions are denoted by same or similar reference numerals throughout the descriptions.

Figure 1:
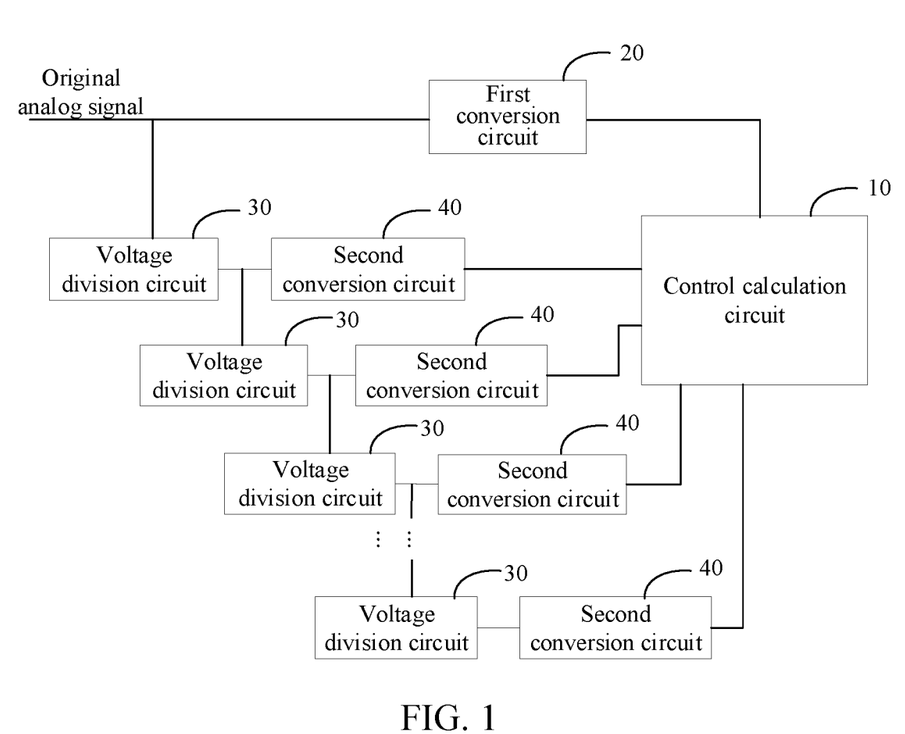
FIG. 1 is a schematic diagram of a structure of an analog-to-digital conversion circuit according to an embodiment of the present disclosure.

As shown in FIG. 1, an analog-to-digital conversion circuit provided by an embodiment of the present disclosure may include a control calculation circuit 10, a first conversion circuit 20, at least one voltage division circuit 30, and at least one second conversion circuit 40 corresponding to the at least one voltage division circuit.

The first conversion circuit 20 is configured to convert an original analog signal to obtain a first digital signal with a first bit width.

The at least one voltage division circuit 30 is configured to divide voltage of a first-stage analog signal to obtain a second-stage analog signal for each voltage division circuit 30, wherein the first-stage analog signal is the original analog signal or a second-stage analog signal output by a previous voltage division circuit adjacent to the voltage division circuit.

The at least one second conversion circuit 40 corresponding to the at least one voltage division circuit 30 is configured to convert the received second-stage analog signal according to a preset algorithm to obtain a second digital signal with a second bit width.

The control calculation circuit 10 is configured to obtain a target digital signal with a third bit width from the first digital signal and the second digital signal, wherein the third bit width is larger than the first bit width, and the third bit width is larger than the second bit width.

For the analog-to-digital conversion circuit provided by the present disclosure, a first conversion circuit converts an original analog signal to obtain a digital signal with a first bit width, and a voltage division circuit divides voltage of a first-stage analog signal to obtain a second-stage analog signal. The first-stage analog signal is the original analog signal or a second-stage analog signal output by the previous voltage division circuit adjacent to the voltage division circuit. A second conversion circuit converts the received second-stage analog signal to obtain a digital signal with a second bit width according to a preset algorithm. A control calculation circuit obtains a target digital signal with a third bit width according to the first digital signal and the second digital signal. The third bit width is larger than the first bit width, and the third bit width is larger than the second bit width. The bit width of the obtained target digital signal is larger than the bit width of the first digital signal obtained by the first conversion circuit and the bit width of the second digital signal obtained by the second conversion circuit. Therefore, the accuracy of the output digital signal can be improved.

It should be noted that, when the previous voltage division circuit is adjacent to the voltage division circuit, that is when the voltage division circuits are connected in series, referring to FIG. 1, for one voltage division circuit and two voltage division circuits adjacent to the voltage division circuit, voltage division is performed by a voltage division circuit closer to the terminal where the original analog signal is input.

In the specific implementation, the analog-to-digital conversion circuit provided by an embodiment of the present disclosure may include one voltage division circuit and one second conversion circuit, or may include a plurality of voltage division circuits and a plurality of second conversion circuits, which will be described separately below.

In some examples, the number of voltage division circuits in the at least one voltage division circuit in the analog-to-digital conversion circuit is one, i.e. the analog-to-digital conversion circuit includes one voltage division circuit and one second conversion circuit.

Figure 2:
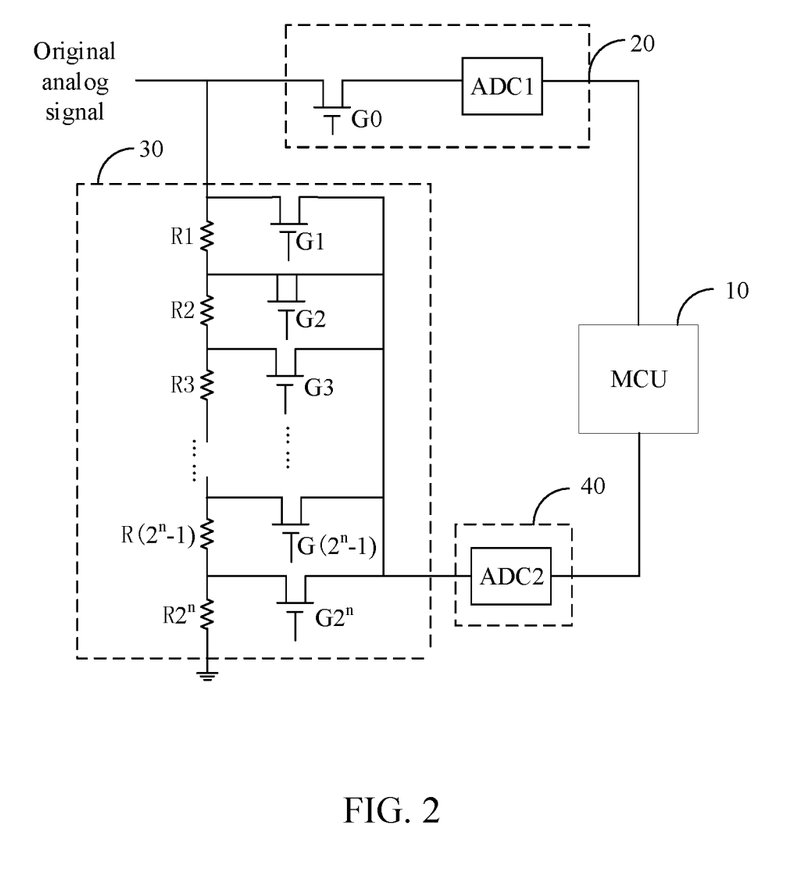
FIG. 2 is a schematic diagram of another structure of an analog-to-digital conversion circuit according to an embodiment of the present disclosure.

FIG. 2 is a schematic diagram of a structure of an analog-to-digital conversion circuit according to an embodiment of the present disclosure. As can be seen from FIG. 2, a voltage division circuit 20 includes $2^n$ voltage division resistors and $2^n$ first switching transistors, and the voltage division resistors are in one-to-one correspondence with the first switching transistors.

The $2^n$ voltage division resistors are connected in series. A first end of a first voltage division resistor R1 is used for inputting the original analog signal, a second end of each voltage division resistor is connected with a first end of a corresponding first switching transistor, and a second end of a last voltage division resistor $R2^n$ is grounded.

Second ends of all the first switching transistors are connected to each other and to an input end of the second conversion circuit, and a control end of each first switching transistor is connected to the control calculation circuit 10 for receiving a control signal sent by the control calculation circuit 10 and controlling turn-on and turn-off of the first switching transistor; wherein n is a positive integer.

It should be noted that in the embodiment disclosed by the present application, each voltage division resistor has a first end and a second end, each first switching transistor has a control end, a first end and a second end, and a second switching transistor has a control end, a first end and a second end.

The first-stage analog signal input to the voltage division circuit 30 is the original analog signal, and the original analog signal will pass through $2^n$ voltage division resistor for voltage division, and the analog signal after being subjected to the voltage division is input to the second conversion circuit 40.

In the embodiment of the present application, the first conversion circuit may include a second switching transistor G0 and a first analog-to-digital converter ADC1 with a first bit width, the second conversion circuit may include a second analog-to-digital converter ADC2, and the control calculation circuit 10 may be an MCU (Microcontroller Unit).

In the implementation, a specific connection mode between circuits can be as follows: a first end of the second switching transistor G0 is used for inputting the original analog signal, a second end of the second switching transistor G0 is connected with an input end of the ADC1, and a control end of the second switching transistor G0 is connected with the MCU for receiving a control signal sent by the MCU for controlling the turn-on and turn-off of the second switching transistor G0. An output end of the ADC1 is connected with the MCU for inputting a first digital signal to the MCU. Second ends of the first switching transistors (G1, G2, G3 . . . G$2^n$) are connected with an input end of the ADC2. An output end of the ADC2 is connected with the MCU for inputting a second digital signal to the MCU.

In specific implementation, at the first sampling time, the MCU controls the switching transistor G0 to turn on by controlling a gate voltage of the second switching transistor G0, and the original analog signal is input to the ADC1, and the original analog signal is converted by the ADC1 to obtain the first digital signal with a first bit width. At the second sampling time, the MCU controls the second switching transistor G0 to turned off by controlling a gate voltage of the second switching transistor G0, and determines one of the first switching transistors in the control voltage division circuit 30 to be turned on according to the first digital signal, so that the original analog signal passes through $2^n$ voltage division resistors for voltage division, and a second-stage analog signal obtained by voltage division is input to the second conversion circuit 40 by controlling the turn-on of the determined first switching transistor. The second conversion circuit 40 converts the received second-stage analog signal according to a preset algorithm to obtain a second digital signal with a second bit width, and the MCU obtains a target digital signal with a third bit width according to the first digital signal and the second digital signal.

The first sampling time is earlier than the second sampling time, that is to say, the collected original analog signal is converted first, and then the voltage division is performed on the collected original analog signal.

When the MCU determines and controls one switching transistor in the voltage division circuit 20 to turned on according to the first digital signal, the MCU can first judge a range of the original analog signal, and then determine whether to divide the voltage according to the range, and a specific method for which can be as follows: if the first digital signal is in a first preset range, the original analog signal is directly input to the ADC2; if the first digital signal is in a second preset range, and the original analog signal is input to the ADC2 after the voltage division.

It should be noted that both end values of the second preset range here are smaller than any value in the first preset range, for example, the first preset range is 0 and 1, and the second preset range is greater than 1.

If it is determined that the original analog signal is directly input to the ADC2, the MCU controls the first switching transistor G1 to turn on. If it is determined that the original analog signal is input to the ADC2 after voltage division, the MCU determines the first switching transistor to be turned on according to the first digital signal. Specifically, the first switching transistor to be turned on can be determined by the following formula:

$$X = [(2^n \times (1 - (1/adc1)) + 1];$$

where X is a bit number corresponding to the first switching transistor to be turned on, n is the bit width of ADC2, and adc1 is the first digital signal.

For example, n is 8, the first digital signal is 5, and X=255 can be calculated according to the above formula, then a first switching transistor G255 is turned on. At this time, the original analog signal will pass through 256 voltage division resistors for voltage division. Since a 255th switching transistor is turned on, the analog signal input to ADC2 is a grounded signal obtained after passing through two resistors (R255 and R256) for voltage division.

It should be noted that when calculating the first switching transistor to be turned on according to the above formula, if the calculation result is decimal, the calculation result is rounded.

According to the range of the original analog signal, the MCU determines whether to perform the voltage division on the original analog signal. If the voltage division is not performed, the original analog signal is directly input to the ADC2. If it is determined to perform the voltage division, the voltage division is performed on the original analog signal and the MCU determines which first switching transistor to be turned on through calculation, so that the signal input to the ADC2 is a ground voltage at a position of the first switching transistor which is turned on. The ADC2 converts the input analog signal according to a preset algorithm to obtain the second digital signal with the second bit width.

In the embodiment of the present application, the analog signal is converted according to the preset algorithm, that is, the analog signal is first amplified according to the preset algorithm, and then the amplified analog signal is converted to a digital signal. Specifically, the analog signal can be amplified in ADC2, MCU or other modules. If the analog signal is converted in MCU or other modules, the analog signal is first sent to MCU or other modules. The analog signal is amplified in MCU or other modules through the preset algorithm, and then the amplified analog signal is sent to the ADC2, and the analog-to-digital conversion is performed on the amplified analog signal through the ADC2.

The preset algorithm in the embodiment of the present disclosure can be A-law 13 polyline algorithm. The A-law 13 polyline algorithm takes 1/4096 as a minimum quantization unit for an input level signal from 0 to 1, and when uniform quantization of linear coding is performed, the quantization interval number is 4096=2^12, and the required binary bits are 12 bits, and 13 bits in total plus a sign bit.

In the current international standard, A=87.6, when the signal is very small, the signal is amplified by 16 times. A-law compression expression is a continuous smooth curve, which is difficult to be accurately realized by electronic circuit. Now, with the development of digital circuit technology, this characteristic can be easily approximated by a digital circuit. The 13 polyline characteristic is similar to the characteristic of A compression law. As shown in the curve graph of FIG. 3, each segment is evenly divided into 16 equal parts, and each part represents a quantization level. Obviously, there are 16×8=128=2^7 quantization levels for 8 segments, which require binary 7-bit coding for expression. It can be seen that each quantization level is not uniform. The quantization step of small signal is very small, which reduces the quantization noise in small signal. If calculated by uniform quantization, in the unit of minimum step $(1/128)*(1/16)$, the maximum signal needs L=128×16=2048=2^11 quantization levels for expression, which require 11-bit coding. Such non-uniform coding reduces the quantization step of a small signal by 16 times, which is equivalent to improving the signal-to-noise ratio of the small signal by 20 dB.

Figure 3:
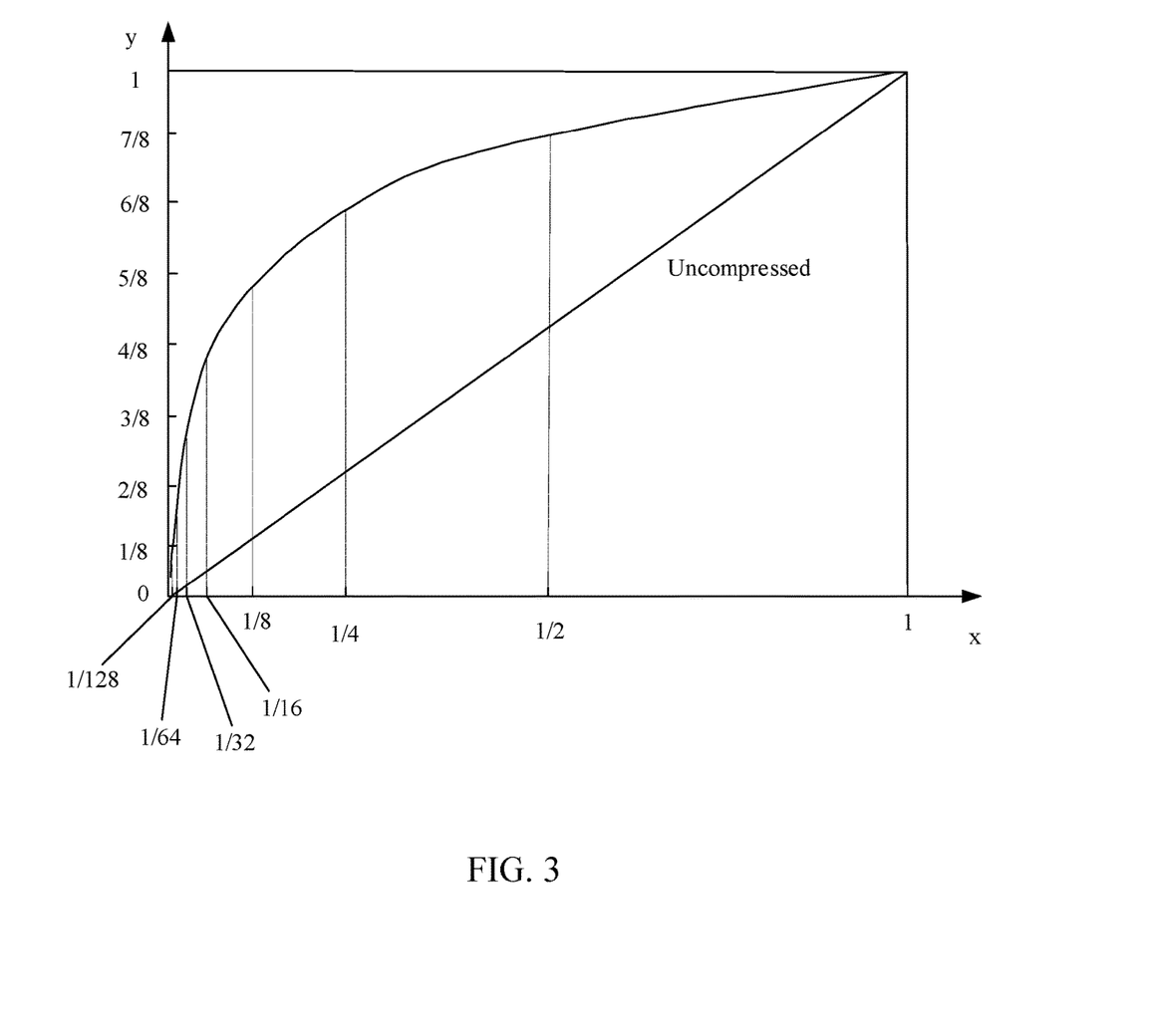
FIG. 3 is a schematic diagram of A-law 13 polyline algorithm.

That is to say, the small analog signal is amplified by 16 times through the A-law 13 polyline algorithm, and then converted by the ADC2 to obtain a value of the second digital signal with the second bit width.

In the embodiment of the present disclosure, the bit width of ADC1 and the bit width of ADC2 may be the same, and both may be the first bit width, such as 8 bit.

When calculating a value of the target digital signal with the third bit width, the MCU can adjust the first digital signal based on a preset value, and take a sum of the adjusted digital signal and the second digital signal as the target digital signal.

The preset value can correspond to the preset algorithm, for example, if the preset algorithm is A-law 13 polyline algorithm, the preset value is 16. If the preset algorithm is another algorithm, the preset value also needs to be varied.

For ease of understanding, a specific embodiment will be described below.

In practice, two analog-to-digital converters with a same bit width can be used, for example, two low bit width analog-to-digital converters ADC1 and ADC2 with 8 bit and same reference voltage, while the A-law 13 polyline algorithm can be used to convert the second-stage analog signal. Resistance values of the voltage division resistors are equal, that is, R1=R2=R3= . . . =R2ⁿ-1=R2ⁿ, the embodiment of the present application is described by taking analog-to-digital converters with 8 bit as an example, then there will be 256 voltage division resistors with same resistance values in total and the same number of first switches corresponding to the 256 voltage division resistors to form the voltage division circuit.

At the first sampling time, the MCU controls a gate of the second switching transistor G0 to turn on, the original analog signal is input to the ADC1, and the ADC1 converts the original analog signal to obtain a first digital signal, and a value of the first digital signal ADC1 is an integer between 0 and 255 due to the use of an analog-to-digital converter with 8 bit;

At the second sampling time, the MCU controls the switching transistor G0 to turn off, and turns on the gate of the first switching transistor according to the value of the first digital signal. Assuming adc1=1, the MCU controls the switching transistor G1 to turn on, that is, the original analog signal is directly input to the ADC2. Assuming adc1 is 172, then calculation is performed according to the formula X=[(2ⁿ×(1−(1/adc1))+1) to obtain X=255 (rounded result), that is, by controlling the gate voltage of G255, G255 is controlled to be turned on. The voltage division circuit 30 divides a voltage of the first-stage analog signal (i.e., the original analog signal) through 256 voltage division resistors. Since G255 is turned on, the analog signal input to the ADC2 is the signal after the original analog signal is grounded and subjected to the voltage division, that is, a ground voltage of the first end of R255.

Because all the voltage division resistors in the voltage division circuit have equal resistance, according to Thevenin's theorem, voltages at two ends of the voltage division resistors will be evenly distributed to two ends of each voltage division resistor, at the same time, ADC1 and ADC2 are same analog-to-digital converters. When the preset algorithm is the A-law 13 polyline algorithm, if an (0–1/64) interval of the algorithm is selected for amplifying the signal input to the ADC2, the second-stage analog signal input to the front end of the ADC2 must be within the (0–1/64) range of the ADC2.

It should be noted that the resistance value of each voltage division resistor in the embodiment of the present application can be the same or different. If the resistance value of each voltage division resistor is the same, the obtained analog signal after the voltage division is more accurate.

PCM encoding is performed on the ADC2 in the A-law 13 polyline mode. The specific encoding contents can be referred to as follows:

Linear Input Code Compressed Code
 0000000wxyza 000wxyz
 0000001wxyza 001 wxyz
 000001 wxyzab 010wxyz
 00001 wxyzabc 011 wxyz
 0001 wxyzabcd 100wxyz
 001wxyzabcde 101 wxyz
 01wxyzabcdef 110wxyz
 1 wxyzabcdefg 111wxyz After the encoding is completed, the value adc2 of the second digital signal outputted by the ADC2 is a digital signal value obtained by converting the second-stage analog signal by PCM encoding in the A-law 13 polyline mode, that is, 16 times of an digital signal value outputted without the A-law 13 polyline.

Since there is a linear correspondence between the first digital signal output by ADC1 and the original analog signal, in order to combine the two signal values, the following calculations can be made in the MCU:

$$ADC = (adc1 - 1) \times 16 + adc2;$$

In the above formula, ADC is the target digital signal, adc1 is the first digital signal, and adc2 is the second digital signal.

In particular, when adc1 is not greater than 1, the gate of G1 is directly turned on, and the value of the second digital signal adc2 output by the ADC2 will be 16 times of the digital signal value obtained by converting the original analog signal without using A-law 13 polygline method. We can do the following calculations in the MCU:

$$ADC = adc2;$$

According to the above scheme, a digital signal value of a high bit width can be obtained through sampling by two analog-to-digital converters with low bit width, and a conversion accuracy of the digital signal can be improved.

In some examples, the number of voltage division circuits in at least one voltage division circuit in the analog-to-digital conversion circuit is multiple, i.e. the analog-to-digital conversion circuit includes a plurality of voltage division circuits and a plurality of second conversion circuits.

If a plurality of voltage division circuits 20 are included, a connection mode of the voltage division circuits 20 may be series connection, parallel connection, or partial series connection and partial parallel connection, and may be arranged according to actual needs in the actual implementation.

These three connection modes are described below.

As shown in FIG. 1, an analog-to-digital conversion circuit is provided according to an embodiment of the present disclosure. As can be seen from FIG. 1, a plurality of voltage division circuits 20 are connected in series. A first voltage division circuit divides a voltage of the original analog signal, a second voltage division circuit divides the voltage of the analog signal after the second voltage division circuit divides the voltage of the analog signal, and so on.

A specific structure of each voltage division circuit is described above and will not be repeated here.

In this circuit, an original analog signal is firstly input into the first conversion circuit, a first digital signal is obtained after the first conversion circuit converts the original analog signal, the control calculation circuit determines to turn on one switching transistor in the first voltage division circuit according to the first digital signal, so that a first second-stage analog signal is obtained after the voltage division circuit performs voltage division on the original analog signal. A first second conversion circuit converts a first second-stage analog signal according to a preset algorithm to obtain a first second digital signal, the control calculation circuit controls the first second conversion circuit to stop receiving the analog signal, and determines to turn on one switching transistor in the second voltage division circuit according to the first second digital signal. The second voltage division circuit receives a second-stage analog signal output by the first voltage division circuit, divides a voltage of the received second-stage analog signal to obtain a second second-stage analog signal. The second second conversion circuit converts the second second-stage analog signal according to the preset algorithm to obtain a second second digital signal, and the control calculation unit determines to turn on one switching transistor in the third voltage division circuit according to the second second digital signal. According to the method described above, the control calculation unit finally determines a target digital signal according to the received first digital signal and at least one second digital signal.

It should be noted that the preset algorithm in each second conversion circuit may be the same or different.

The more voltage division circuits, the more accurate the conversion accuracy of the target digital signal value.

Figure 4:
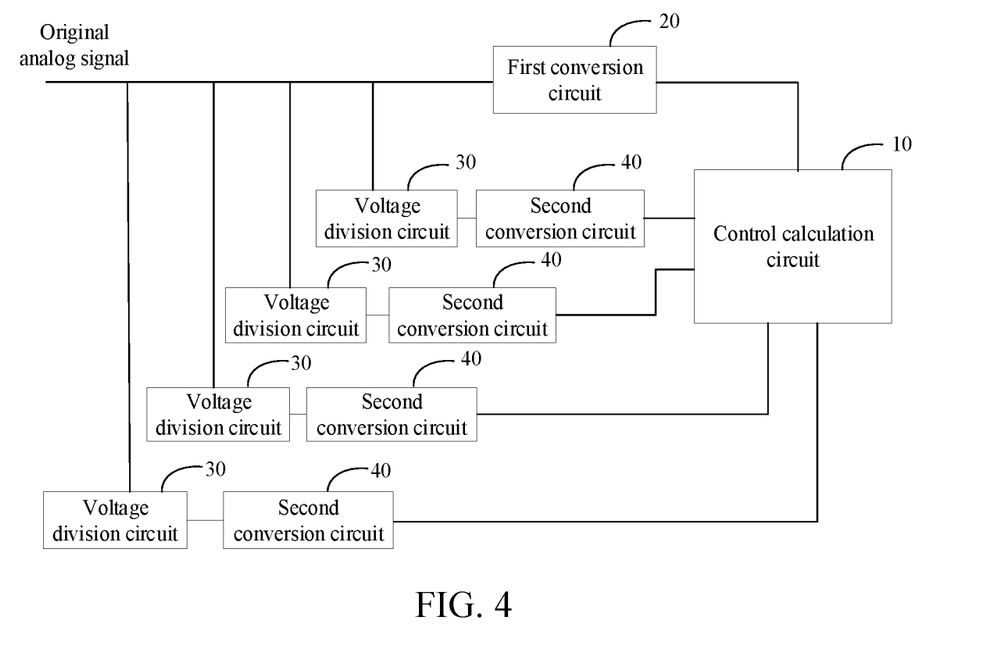
FIG. 4 is a schematic diagram of another structure of an analog-to-digital conversion circuit according to an embodiment of the present disclosure.

As shown in FIG. 4, another analog-to-digital conversion circuit is provided according to an embodiment of the present disclosure. As can be seen from FIG. 4, four voltage division circuits and four second conversion circuits are included in the analog-to-digital conversion circuit. The four voltage division circuits are connected in parallel and the original analog signal are input to all of the four voltage division circuits, that is, all the voltage division circuits divide voltage of the original analog signals, and then input the analog signals after the voltage division to their corresponding second conversion circuits for conversion.

The specific implementation method of this circuit can refer to the method in FIG. 1, except that analog signals after subjected to the voltage division performed by the previous voltage division circuit is input to some of the voltage division circuits in FIG. 1, while the original analog signal is input to each voltage division circuit in FIG. 4.

Figure 5:
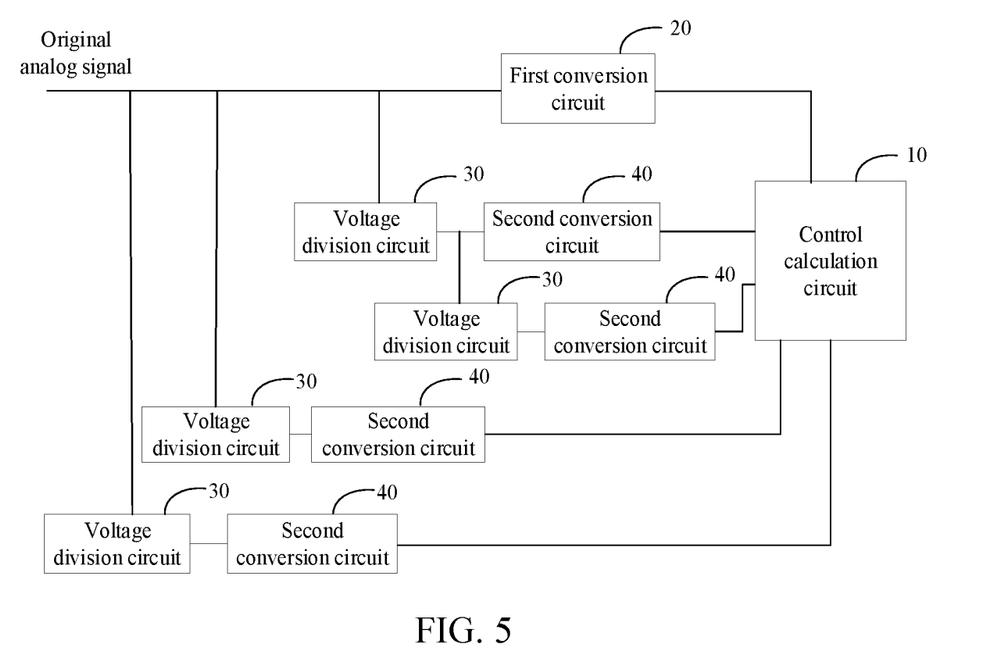
FIG. 5 is a schematic diagram of another structure of an analog-to-digital conversion circuit according to an embodiment of the present disclosure.

As shown in FIG. 5, another analog-to-digital conversion circuit is provided according to an embodiment of the present disclosure. In FIG. 5, the first voltage division circuit and the second voltage division circuit are connected in series and connected in parallel with the third voltage division circuit and the fourth voltage division circuit.

The implementation method of this circuit can refer to the method in FIG. 1, which will not be described here.

It should be noted that the switching transistors mentioned in the above-mentioned embodiment of the present application may be Thin Film Transistors (TFT) or Metal Oxide Semiconductor field effect transistors (MOS), which is not limited herein. In the specific implementation, a control end of each switching transistor is used as its gate, and the first end of each switching transistor can be used as a source and the second end of each switching transistor can be used as a drain according to transistor types and different input signals. Alternatively, the first end of each switching transistor is used as the drain and the second end of each switching transistor is used as the source, without making specific distinction here.

In the embodiment of the present application, a plurality of voltage division circuits are connected in parallel. As shown in FIGS. 4 and 5, input ends of the plurality of voltage division circuits are connected to each other, and output ends of the plurality of voltage division circuits are indirectly connected to the MCU. For example, the output end of each voltage division circuit is connected to an input end of a corresponding second conversion circuit, and an output end of the corresponding second conversion circuit is connected to the MCU.

Based on the same concept, the present disclosure further provides an analog-to-digital conversion method, which is applied to any of the above analog-to-digital conversion circuits. A principle for solving problem provided by this method is similar to that of the aforementioned analog-to-digital conversion circuits, so that implementation of the method can refer to the implementation of the analog-to-digital conversion circuit, which will not be repeated here.

Figure 6:
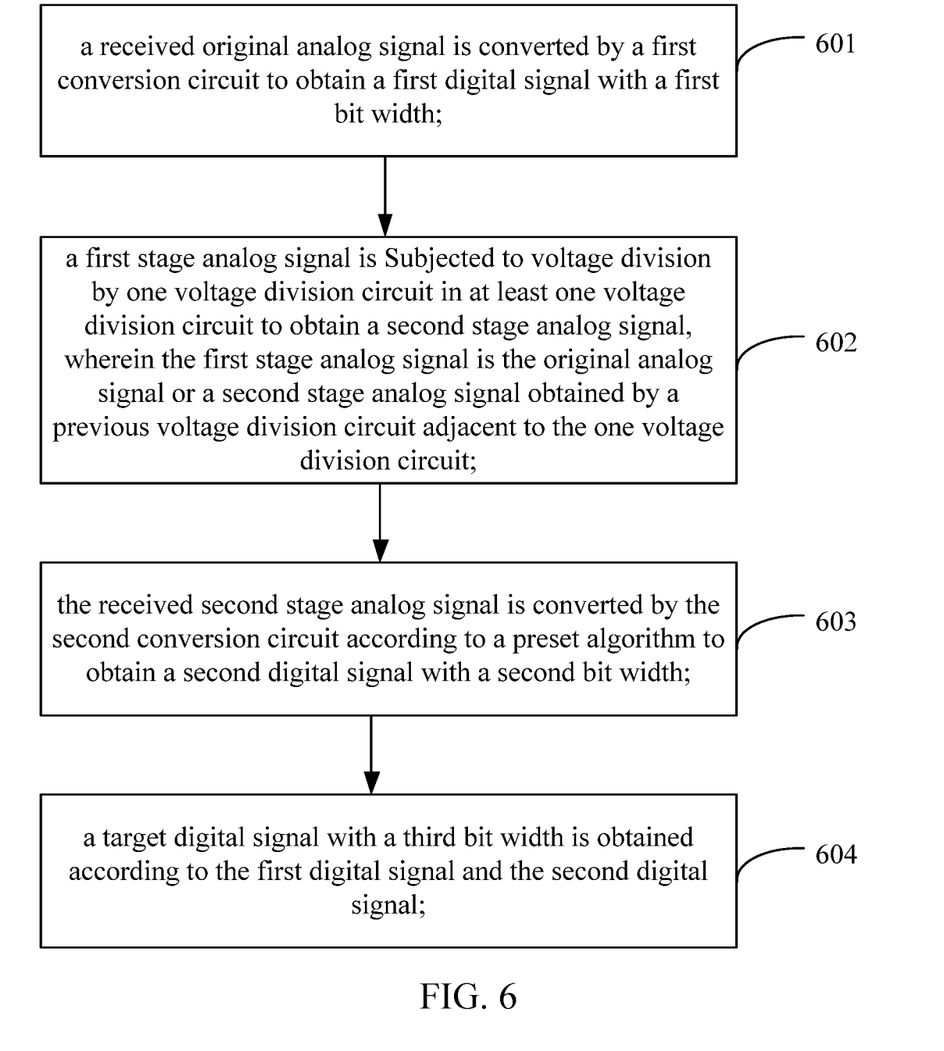
FIG. 6 is a schematic diagram of a structure of an analog-to-digital conversion method according to an embodiment of the present disclosure.

As shown in FIG. 6, the analog-to-digital conversion method provided by the present disclosure includes the following steps:

S601: a received original analog signal is converted by a first conversion circuit to obtain a first digital signal with a first bit width;

S602: voltage division is performed by one voltage division circuit in the at least one voltage division circuit on a first stage analog signal to obtain a second-stage analog signal, wherein the first stage analog signal is the original analog signal or a second-stage analog signal obtained by a previous voltage division circuit adjacent to the one voltage division circuit;

S603: the received second-stage analog signal is converted by the second conversion circuit according to a preset algorithm to obtain a second digital signal with a second bit width; and S604: a target digital signal with a third bit width is obtained according to the first digital signal and the second digital signal;

wherein the third bit width is larger than the first bit width, and the third bit width is larger than the second bit width.

In the embodiment of the present application, the original analog signal is converted by the first conversion circuit to obtain the digital signal with the first bit width, the voltage division is performed by the voltage division circuit on the first-stage analog signal to obtain the second-stage analog signal, the first-stage analog signal is the original analog signal or a second-stage analog signal obtained by the previous voltage division circuit adjacent to the voltage division circuit. The second conversion circuit converts the received second-stage analog signal to obtain the digital signal with the second bit width according to the preset algorithm, and finally the target digital signal with the third bit width is obtained according to the first digital signal and the second digital signal. The third bit width is larger than the first bit width, and the third bit width is larger than the second bit width. Since the bit width of the obtained target digital signal is larger than the bit width of the first digital signal obtained by the first conversion circuit and the bit width of the second digital signal obtained by the second conversion circuit, the accuracy of the output digital signal can be improved.

Optionally, the number of voltage division circuit(s) in the at least one voltage division circuit is one.

The step in which the voltage division is performed by one voltage division circuit in the at least one voltage division circuit on the first-stage analog signal to obtain the second-stage analog signal includes:

according to the first digital signal, voltage division is performed on the first-stage analog signal by controlling one switching transistor in the voltage division circuit to turn on to obtain the second-stage analog signal, wherein the first-stage analog signal is the original analog signal.

Optionally, the number of voltage division circuits in the at least one voltage division circuit is multiple, and the plurality of voltage division circuits are connected in series.

The step in which the voltage division is performed by one voltage division circuit in the at least one voltage division circuit on the first-stage analog signal to obtain the second-stage analog signal includes:

according to the first digital signal, voltage division is performed on the first-stage analog signal by controlling one switching transistor in one voltage division circuit of the at least one voltage division circuit to turn on to obtain the second-stage analog signal, wherein the first-stage analog signal is the second-stage analog signal output by the previous voltage division circuit adjacent to the one voltage division circuit.

Optionally, the number of voltage division circuits in the at least one voltage division circuit is multiple, and the multiple voltage division circuits are connected in parallel.

The step in which voltage division is performed on the first-stage analog signal by one voltage division circuit in the at least one voltage division circuit to obtain a second-stage analog signal includes:

according to the first digital signal, voltage division is performed on the first-stage analog signal by controlling one switching transistor in one voltage division circuit of the at least one voltage division circuit to turn on to obtain the second-stage analog signal, wherein the first-stage analog signal is the original analog signal.

Optionally, the second-stage analog signal is equal to the original analog signal by controlling one switching transistor in one voltage division circuit of the at least one voltage division circuit to turn on if the first digital signal is within a first preset range; and voltage division is performed on the original analog signal according to the first digital signal by controlling one switching transistor of the voltage division circuit to turn on to obtain the second-stage analog signal if the first digital signal is within a second preset range.

Optionally, the step in which the target digital signal with the third bit width is obtained according to the first digital signal and the second digital signal includes:

the first digital signal is adjusted based on a preset value;
a sum of the adjusted digital signal and the second digital signal is used as the target digital signal.

Optionally, the preset algorithm is an A-law 13 polyline algorithm.

Based on the same concept, an embodiment of the present disclosure further provides an integrated chip including any of the above-mentioned analog-to-digital conversion circuits. A principle for solving problem provided by the integrated chip is similar to that of the aforementioned analog-to-digital conversion circuit, so implementation of the integrated chip can refer to the implementation of the aforementioned analog-to-digital conversion circuit, which will not be repeated here.

Based on the same concept, an embodiment of the present disclosure further provides a display device, which includes any of the above integrated chips. A principle for solving problem provided by the display device is similar to that of the analog-to-digital conversion circuit in the aforementioned integrated chip, so the implementation of the display device can refer to the implementation of the analog-to-digital conversion circuit in the aforementioned integrated chip, which will not be repeated here.

In specific implementation, the display device in the embodiments of the present disclosure may be any product or component with a display function, such as a mobile phone, a tablet computer, a television, a display, a laptop computer, a digital photo frame, or a navigator. Other essential components included in the display device which should be understood to be included in the display device by those of ordinary skill in the art will not be described repeatedly herein, and should not be taken as a limitation on the present disclosure.

Apparently, various modifications and variations to the present disclosure may be made by those skilled in the art without departing from the spirit and scope of the present disclosure. Thus, if these modifications and variations to the present disclosure fall within the scope of the claims of the present disclosure and their equivalent techniques, the present disclosure is intended to include these modifications and variations.

The invention claimed is:

1. An analog-to-digital conversion circuit, comprising:
   a first conversion circuit, configured to convert an original analog signal to obtain a first digital signal with a first bit width;
   at least one voltage division circuit, each voltage division circuit among which is configured to divide a voltage of a first-stage analog signal to obtain a second-stage analog signal, wherein the first-stage analog signal is the original analog signal or a second-stage analog signal output by a previous voltage division circuit adjacent to the voltage division circuit;
   a second conversion circuit corresponding to the voltage division circuit, configured to convert the received second-stage analog signal according to a preset algorithm to obtain a second digital signal with a second bit width; and
   a control calculation circuit, configured to obtain a target digital signal with a third bit width according to the first digital signal and the second digital signal;

wherein the third bit width is larger than the first bit width, and the third bit width is larger than the second bit width; and wherein each voltage division circuit comprises a plurality of voltage division resistors, and a first switching transistor corresponding to each voltage division resistor;

the plurality of voltage division resistors are connected in series;

in the voltage division resistors which are connected in series, a first end of each voltage division resistor is connected with a first end of the corresponding first switching transistor;

second ends of the first switching transistor are connected to each other and a second end of each first switching transistor is connected to the second conversion circuit corresponding to the voltage division circuit, and a control end of each first switching transistor is connected to the control calculation circuit; and a first end of a first voltage division resistor is used for inputting the first-stage analog signal, and a second end of a last voltage division resistor is grounded.

2. The circuit according to claim 1, wherein a quantity of voltage division circuits in the at least one voltage division circuit is one; and the first-stage analog signal is the original analog signal.

3. The circuit according to claim 1, wherein a quantity of voltage division circuits in the at least one voltage division circuit is a plurality, and the plurality of voltage division circuits are connected in series; and the first-stage analog signal is a second-stage analog signal output by a previous voltage division circuit connected in series with the voltage division circuit.

4. The circuit according to claim 1, wherein a quantity of voltage division circuits in the at least one voltage division circuit is a plurality, and the plurality of voltage division circuits are connected in parallel; and the first-stage analog signal is the original analog signal.

5. The circuit according to claim 1, wherein the control calculation circuit is configured to control one first switching transistor of the at least one voltage division circuit to turn on according to the first digital signal.

6. The circuit according to claim 1, wherein the first conversion circuit comprises a first analog-to-digital converter with the first bit width and a second switching transistor;

a first end of the second switching transistor is configured to input the original analog signal, a second end of the second switching transistor is electrically connected with an input end of the first analog-to-digital converter, a control end of the second switching transistor is electrically connected with the control calculation circuit, and an output end of the first analog-to-digital converter is electrically connected with the control calculation circuit; and the control calculation circuit is configured to control the second switching transistor to turn on at first sampling time and to control the second switching transistor to turn off at second sampling time, wherein the first sampling time is earlier than the second sampling time.

7. The circuit according to claim 6, wherein the second conversion circuit comprises a second analog-to-digital converter;

an input end of the second analog-to-digital converter is electrically connected with a second end of each first switching transistor in a voltage division circuit corresponding to the second analog-to-digital converter, and an output end of the second analog-to-digital converter is electrically connected with the control calculation circuit; and the control calculation circuit is configured to control a first switching transistor corresponding to a first voltage division resistor of the at least one voltage division circuit at the second sampling time if the first digital signal is within a first preset range; to control one first switching transistor of the at least one voltage division circuit to turn on at the second sampling time according to the first digital signal if the first digital signal is within a second preset range.

8. The circuit according to claim 1, wherein the control calculation circuit is configured to:

adjust the first digital signal based on a preset value; and sum the adjusted digital signal and the second digital signal as the target digital signal.

9. The circuit according to claim 6, wherein the bit width of the first analog-to-digital converter is equal to the bit width of the second analog-to-digital converter.

10. The circuit of claim 9, wherein the preset algorithm is A-law 13 polyline algorithm.

11. An integrated chip, comprising the analog-to-digital conversion circuit according to claim 1.

12. A display device, comprising the integrated chip of claim 11.

13. An analog-to-digital conversion method applied to the circuit of claim 1, wherein the method comprises:

converting, by the first conversion circuit, the received original analog signal to obtain the first digital signal with the first bit width;

performing voltage division, by one voltage division circuit of the at least one voltage division circuit, on the first-stage analog signal to obtain the second-stage analog signal, wherein the first-stage analog signal is the original analog signal or the second-stage analog signal obtained by the previous voltage division circuit adjacent to the one voltage division circuit;

converting, by the second conversion circuit, the received second-stage analog signal according to the preset algorithm to obtain the second digital signal with the second bit width; and obtaining the target digital signal with the third bit width according to the first digital signal and the second digital signal value;

wherein the third bit width is larger than the first bit width, and the third bit width is larger than the second bit width.

14. The method according to claim 13, wherein a quantity of voltage division circuits in the at least one voltage division circuit is one;

the step of performing the voltage division by the one voltage division circuit of the at least one voltage division circuit on the first-stage analog signal to obtain the second-stage analog signal comprises:

according to the first digital signal, performing voltage division on the first-stage analog signal by controlling one switching transistor in the voltage division circuit to turn on to obtain the second-stage analog signal, wherein the first-stage analog signal is the original analog signal.

15. The method according to claim 13, wherein a quantity of voltage division circuits in the at least one voltage division circuit is a plurality, and the plurality of voltage division circuits are connected in series;

the step of performing the voltage division by the one voltage division circuit of the at least one voltage division circuit on the first-stage analog signal to obtain the second-stage analog signal comprises:

according to the first digital signal, performing voltage division on the first-stage analog signal by controlling one switching transistor in one voltage division circuit of the at least one voltage division circuit to turn on to obtain the second-stage analog signal, wherein the first-stage analog signal is a second-stage analog signal output by a previous voltage division circuit adjacent to the one voltage division circuit.

16. The method according to claim 13, wherein a quantity of voltage division circuits in the at least one voltage division circuit is a plurality, and the plurality of voltage division circuits are connected in parallel;

the step of performing the voltage division by the one voltage division circuit of the at least one voltage division circuit on the first-stage analog signal to obtain the second-stage analog signal comprises:

according to the first digital signal, performing voltage division on the first-stage analog signal by controlling one switching transistor in one voltage division circuit of the at least one voltage division circuit to turn on to obtain the second-stage analog signal, wherein the first-stage analog signal is the original analog signal.

17. The method according to claim 13, wherein the second-stage analog signal is equal to the original analog signal by controlling one switching transistor in one voltage division circuit of the at least one voltage division circuit to turn on if the first digital signal is within a first preset range; and voltage division is performed on the original analog signal according to the first digital signal by controlling one switching transistor in one voltage division circuit of the at least one voltage division circuit to turn on to obtain the second-stage analog signal if the first digital signal is within a second preset range.

18. The method according to claim 13, wherein, the step of obtaining the target digital signal with the third bit width according to the first digital signal and the second digital signal value comprises:

adjusting the first digital signal based on a preset value; and summing the adjusted digital signal and the second digital signal as the target digital signal.

* * * * *